(12) United States Patent  
Negley

(10) Patent No.: US 8,269,240 B2
(45) Date of Patent: Sep. 18, 2012

(54) SEMICONDUCTOR LIGHT EMITTING DEVICES INCLUDING MULTIPLE SEMICONDUCTOR LIGHT EMITTING ELEMENTS IN A SUBSTRATE CAVITY

(75) Inventor: Gerald H. Negley, Carrboro, NC (US)

(73) Assignee: Cree, Inc., Durham, NC (US)

(*) Notice: Subject to any disclaimer, the term of this patent is extended or adjusted under 35 U.S.C. 154(b) by 49 days.

(21) Appl. No.: 12/484,667

(22) Filed: Jun. 15, 2009

(65) Prior Publication Data

US 2009/0250710 A1 Oct. 8, 2009

Related U.S. Application Data

(60) Continuation of application No. 12/031,951, filed on Feb. 15, 2008, now Pat. No. 7,858,998, which is a division of application No. 10/811,598, filed on Mar. 29, 2004, now Pat. No. 7,355,284.

(51) Int. Cl.
*H01L 33/00* (2010.01)

(52) U.S. Cl. ............ 257/98; 257/E33.061; 257/E33.059

(58) Field of Classification Search ...................... 257/98
See application file for complete search history.

(56) References Cited

U.S. PATENT DOCUMENTS

| | | |
|---|---|---|
| 4,152,618 A | 5/1979 | Abe et al. |
| 4,154,219 A | 5/1979 | Gupta et al. |
| 4,168,102 A | 9/1979 | Chida et al. |
| 4,545,366 A | 10/1985 | O'Neill |
| 4,711,972 A | 12/1987 | O'Neill |
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,277,840 A | 1/1994 | Osaka et al. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,813,753 A | 9/1998 | Vriens et al. |
| 5,858,278 A | 1/1999 | Itoh et al. |
| 5,912,477 A | 6/1999 | Negley |
| 5,959,316 A | 9/1999 | Lowery |

(Continued)

FOREIGN PATENT DOCUMENTS

JP 57076885 5/1982

(Continued)

OTHER PUBLICATIONS

Notification of Transmittal of the International Search Report and the Written Opinion of the International Searching Authority, or the Declaration, International Search Report, and Written Opinion of the International Searching Authority, PCT/US2005/001714, Nov. 3, 2005.

(Continued)

*Primary Examiner* — Thien F Tran
(74) *Attorney, Agent, or Firm* — Myers Bigel Sibley & Sajovec, P.A.

(57) ABSTRACT

Semiconductor light emitting devices include a substrate having a cavity, multiple light emitting devices in the cavity and remote phosphor layers, scattering layers and/or lenses for the light emitting devices.

18 Claims, 3 Drawing Sheets

U.S. PATENT DOCUMENTS

| | | | |
|---|---|---|---|
| 5,998,925 A | 12/1999 | Shimizu et al. | |
| 6,031,179 A | 2/2000 | O'Neill | |
| 6,061,111 A * | 5/2000 | Kataoka et al. | 349/113 |
| 6,069,440 A | 5/2000 | Shimizu et al. | |
| 6,075,200 A | 6/2000 | O'Neill | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,204,523 B1 | 3/2001 | Carey et al. | |
| 6,234,648 B1 | 5/2001 | Borner et al. | |
| 6,252,254 B1 | 6/2001 | Soules et al. | |
| 6,411,046 B1 | 6/2002 | Muthu | |
| 6,483,196 B1 | 11/2002 | Wojnarowski et al. | |
| 6,489,637 B1 | 12/2002 | Sakamoto et al. | |
| 6,518,600 B1 | 2/2003 | Shaddock | |
| 6,521,916 B2 | 2/2003 | Roberts et al. | |
| 6,541,800 B2 | 4/2003 | Barnett et al. | |
| 6,577,073 B2 | 6/2003 | Shimizu et al. | |
| 6,817,735 B2 | 11/2004 | Shimizu et al. | |
| 6,841,804 B1 | 1/2005 | Chen et al. | |
| 6,849,867 B2 | 2/2005 | Roberts et al. | |
| 6,853,010 B2 | 2/2005 | Slater, Jr. et al. | |
| 6,921,926 B2 | 7/2005 | Hsu | |
| 7,005,679 B2 | 2/2006 | Tarsa et al. | |
| 7,029,935 B2 | 4/2006 | Negley et al. | |
| 7,084,435 B2 | 8/2006 | Sugimoto et al. | |
| 7,126,274 B2 | 10/2006 | Shimizu et al. | |
| 7,183,587 B2 | 2/2007 | Negley et al. | |
| 7,190,387 B2 | 3/2007 | Rinehart et al. | |
| 7,192,692 B2 | 3/2007 | Wood et al. | |
| 7,213,940 B1 | 5/2007 | van de Ven et al. | |
| 7,215,074 B2 | 5/2007 | Shimizu et al. | |
| 7,251,079 B2 | 7/2007 | Capaldo et al. | |
| 7,262,912 B2 | 8/2007 | Wood | |
| 7,264,378 B2 | 9/2007 | Loh | |
| 7,324,276 B2 | 1/2008 | Wood | |
| 7,355,284 B2 | 4/2008 | Negley | |
| 7,420,742 B2 | 9/2008 | Wood et al. | |
| 7,465,414 B2 | 12/2008 | Knox et al. | |
| 7,482,638 B2 | 1/2009 | Wall, Jr. | |
| 7,502,169 B2 | 3/2009 | Wood | |
| 7,614,759 B2 | 11/2009 | Negley | |
| 7,622,803 B2 | 11/2009 | Parker et al. | |
| 7,709,853 B2 | 5/2010 | Medendorp, Jr. | |
| 7,718,991 B2 | 5/2010 | Negley | |
| 7,722,220 B2 | 5/2010 | van de Ven | |
| 2002/0088987 A1 | 7/2002 | Sakurai | |
| 2002/0113244 A1 | 8/2002 | Barnett et al. | |
| 2002/0113246 A1 | 8/2002 | Nagai et al. | |
| 2002/0123164 A1 | 9/2002 | Slater, Jr. et al. | |
| 2002/0151941 A1* | 10/2002 | Okawa et al. | 607/99 |
| 2003/0006418 A1 | 1/2003 | Emerson et al. | |
| 2003/0209714 A1 | 11/2003 | Taskar et al. | |
| 2004/0072106 A1 | 4/2004 | Chua et al. | |
| 2004/0130912 A1 | 7/2004 | Miyashita | |
| 2004/0227149 A1 | 11/2004 | Ibbetson et al. | |
| 2005/0058948 A1 | 3/2005 | Freese et al. | |
| 2005/0062140 A1 | 3/2005 | Leung | |
| 2005/0082974 A1 | 4/2005 | Fukasawa et al. | |
| 2005/0158893 A1* | 7/2005 | Silverbrook | 438/22 |
| 2005/0168689 A1 | 8/2005 | Knox | |
| 2005/0224829 A1 | 10/2005 | Negley et al. | |
| 2006/0061869 A1 | 3/2006 | Fadel et al. | |
| 2006/0275714 A1 | 12/2006 | Rinehart et al. | |
| 2006/0285332 A1 | 12/2006 | Goon et al. | |
| 2007/0003868 A1 | 1/2007 | Wood et al. | |
| 2007/0008738 A1 | 1/2007 | Han et al. | |
| 2007/0139923 A1 | 6/2007 | Negley et al. | |
| 2007/0170447 A1 | 7/2007 | Negley et al. | |
| 2007/0247414 A1 | 10/2007 | Roberts | |
| 2007/0274080 A1 | 11/2007 | Negley et al. | |
| 2007/0278934 A1 | 12/2007 | van de Ven et al. | |
| 2007/0279903 A1 | 12/2007 | Negley et al. | |
| 2007/0280624 A1 | 12/2007 | Negley et al. | |
| 2008/0044934 A1 | 2/2008 | Loh et al. | |
| 2008/0084685 A1 | 4/2008 | van de Ven et al. | |
| 2008/0084700 A1 | 4/2008 | van de Ven | |
| 2008/0084701 A1 | 4/2008 | van de Ven et al. | |
| 2008/0089053 A1 | 4/2008 | Negley | |
| 2008/0106895 A1 | 5/2008 | van de Ven et al. | |
| 2008/0106907 A1 | 5/2008 | Trott et al. | |
| 2008/0112168 A1 | 5/2008 | Pickard et al. | |
| 2008/0112170 A1 | 5/2008 | Trott et al. | |
| 2008/0112183 A1 | 5/2008 | Negley | |
| 2008/0130281 A1 | 6/2008 | Negley | |
| 2008/0130282 A1 | 6/2008 | Negley | |
| 2008/0137347 A1 | 6/2008 | Trott et al. | |
| 2008/0191225 A1 | 8/2008 | Medendorp | |
| 2008/0194061 A1 | 8/2008 | Medendorp | |
| 2008/0258168 A1 | 10/2008 | Loh et al. | |
| 2008/0278950 A1 | 11/2008 | Pickard et al. | |
| 2008/0278952 A1 | 11/2008 | Trott et al. | |
| 2008/0278957 A1 | 11/2008 | Pickard et al. | |
| 2008/0304261 A1 | 12/2008 | van de Ven et al. | |
| 2008/0304269 A1 | 12/2008 | Pickard et al. | |
| 2008/0308825 A1 | 12/2008 | Chakraborty et al. | |
| 2009/0108269 A1 | 4/2009 | Negley et al. | |
| 2009/0152573 A1 | 6/2009 | Loh et al. | |
| 2009/0231835 A1 | 9/2009 | Roberts et al. | |

FOREIGN PATENT DOCUMENTS

| | | |
|---|---|---|
| JP | 2-78102 A | 3/1990 |
| JP | 05-100106 A | 4/1993 |
| JP | 07-307492 A | 11/1995 |
| JP | 08116094 | 5/1996 |
| JP | 11-163412 A | 6/1999 |
| JP | 11251638 | 9/1999 |
| JP | 2003-318448 A | 11/2003 |
| JP | 2006-216609 A | 8/2006 |
| WO | WO 03/007663 A1 | 1/2003 |
| WO | WO 03/010832 A1 | 2/2003 |
| WO | WO 2007/026776 A1 | 3/2007 |
| WO | WO 2007/061758 A1 | 5/2007 |

OTHER PUBLICATIONS

Notification of Transmittal of the International Search Report and the Written Opinion of the International Searching Authority, or the Declaration; International Search Report; and Written Opinion of the International Searching Authority, PCT/US2008/070132, Oct. 14, 2008.

Notification of Transmittal of the International Search Report and the Written Opinion of the International Searching Authority, or the Declaration; International Search Report; and Written Opinion of the International Searching Authority, PCT/US2007/012707, Aug. 21, 2008.

Notification of Transmittal of the International Search Report and the Written Opinion of the International Searching Authority, or the Declaration; International Search Report; and Written Opinion of the International Searching Authority, PCT/US2007/012158, May 2, 2008.

Notification of Transmittal of the International Search Report and the Written Opinion of the International Searching Authority, or the Declaration; International Search Report; and Written Opinion of the International Searching Authority, PCT/US2007/012158, Jun. 9, 2008.

Notification of Transmittal of the International Search Report and the Written Opinion of the International Searching Authority, or the Declaration; International Search Report; and Written Opinion of the International Searching Authority, PCT/US2007/012158, Nov. 3, 2008.

Perduijn et al. "Light Output Feedback Solution for RGB LED Backlight Applications", *SID Symposium Digest of Technical Papers* 34(1):1254-1257, May 2003.

Kato, Presentation "LUXEON™ A New World of Light", Sep. 14, 2004, 19 pp.

Japanese Office Action Corresponding to Japanese Patent Application No. 2007-506144; Date of Mailing: Feb. 28, 2012; Japanese Text, 3 pages, English Translation Thereof, 4 pages.

* cited by examiner

SEMICONDUCTOR LIGHT EMITTING DEVICES INCLUDING MULTIPLE SEMICONDUCTOR LIGHT EMITTING ELEMENTS IN A SUBSTRATE CAVITY

CROSS REFERENCE TO RELATED APPLICATION

This application is a continuation of application Ser. No. 12/031,951, filed Feb. 15, 2008 now U.S. Pat. 7,858,998, which is a divisional of application Ser. No. 10/811,598, filed Mar. 29, 2004 now U.S. Pat. No. 7,355,284, assigned to the assignee of the present application, the disclosures of which are hereby incorporated herein by reference in their entirety as if set forth fully herein.

FIELD OF THE INVENTION

This invention relates to semiconductor light emitting devices and fabricating methods therefor, and more particularly to packaging and packaging methods for semiconductor light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. It is also known that the semiconductor light emitting element generally is packaged to provide external electrical connections, heat sinking, lenses or waveguides, environmental protection and/or or other functions for the semiconductor light emitting device. Packaging may be provided, at least in part, by at least partially surrounding the semiconductor light emitting device with a dome-shaped transparent plastic shell.

For example, it is known to provide a two-piece package for a semiconductor light emitting device wherein the semiconductor light emitting element is mounted on a substrate of, for example, alumina, aluminum nitride and/or other materials, which include electrical traces thereon, to provide external connections for the semiconductor light emitting element. A second substrate, which, for example, may be silver plated copper, is mounted on the first substrate, for example using glue, surrounding the semiconductor light emitting element. A lens may be placed on the second substrate over the semiconductor light emitting element. Light emitting diodes with two-piece packages as described above are described in application Ser. No. 10/446,532 to Loh, entitled Power Surface Mount Light Emitting Die Package, filed May 27, 2003, now U.S. Pat. No. 7,264,378, assigned to the assignee of the present invention, the disclosure of which is hereby incorporated herein by reference in its entirety as if set forth fully herein.

It is often desirable to incorporate phosphor into a semiconductor light emitting device, to enhance the emitted radiation in a particular frequency band and/or to convert at least some of the radiation to another frequency band. Phosphors may be included in a semiconductor light emitting device using many conventional techniques. In one technique, phosphor is coated inside and/or outside the plastic shell. In other techniques, phosphor is coated on the semiconductor light emitting device itself, for example using electrophoretic deposition. In still other techniques, a drop of a material such as epoxy that contains phosphor therein may be placed inside the plastic shell, on the semiconductor light emitting device and/or between the device and the shell. This technique may be referred to as a "glob top". The phosphor coatings may also incorporate an index matching material and/or a separate index matching material may be provided. LEDs that employ phosphor coatings are described, for example, in U.S. Pat. Nos. 6,252,254; 6,069,440; 5,858,278; 5,813,753; 5,277,840; and 5,959,316.

Unfortunately, the packaging for a semiconductor light emitting device may be costly and, in some cases, more costly than the semiconductor light emitting element itself. Moreover, the assembly process also may be costly, time consuming and/or subject to failures.

SUMMARY OF THE INVENTION

Some embodiments of the present invention provide semiconductor light emitting devices that include a substrate having a face, a flexible film that includes therein an optical element, on the face, and a semiconductor light emitting element between the substrate and the flexible film and configured to emit light through the optical element. In some embodiments, an optical coupling media, such as optical gel, is provided between the optical element and the semiconductor light emitting element. In some embodiments, the face includes a cavity therein, and the semiconductor light emitting element is in the cavity. The flexible film extends onto the face beyond the cavity, and the optical element overlies the cavity. In some embodiments, an optical coupling media is provided in the cavity. Semiconductor light emitting devices may be assembled, according to various embodiments of the present invention, by mounting a semiconductor light emitting element on a substrate face, and attaching a flexible film that includes therein an optical element to the substrate face such that, in operation, the semiconductor light emitting element emits lights through the optical element. An optical coupling media may be placed between the semiconductor light emitting element and the optical coupling element.

Many different configurations of optical elements may be provided according to various embodiments of the present invention. In some embodiments, the optical element includes (i.e., comprises) a lens. In other embodiments, the optical element includes a prism. In other embodiments, the flexible film includes a first face adjacent the substrate and a second face remote from the substrate, and the optical element includes a first optical element on the first face, and a second optical element on the second face, both of which are located such that the light emitting element emits light through the first optical element and the second optical element. In some embodiments, the optical element includes phosphor and/or other optical emission enhancing and/or converting elements. In still other embodiments, the optical element includes an optical scattering element. Combinations and subcombinations of these and/or other optical elements also may be provided. Moreover, an optical coupling media may be provided between the optical element and the semiconductor light emitting element in any of these embodiments.

Many configurations of the flexible film also may be provided according to various embodiments of the present invention. For example, in some embodiments, at least a portion of the flexible film that overlies the cavity is transparent to the light, and at least a portion of the flexible film that extends onto the face beyond the cavity is opaque to the light. In other embodiments, at least a portion of the flexible film that overlies the cavity includes a first material and at least a portion of the flexible film that extends onto the face beyond the cavity includes a second material. In still other embodiments, the semiconductor light emitting element includes a wire that extends towards and contacts the flexible film in the cavity, and the flexible film includes a transparent conductor in the cavity that electrically connects to the wire. Combinations and subcombinations of these and/or other configurations of flexible film also may be provided.

In other embodiments, an attachment element also is provided that is configured to attach the flexible film and the substrate to one another. Many conventional attachment techniques can be used to provide an attachment element.

Some embodiments of the present invention may be configured to incorporate phosphor into the semiconductor light emitting device. In some embodiments, phosphor is provided on the flexible film between the lens and the semiconductor light emitting element. In other embodiments, the lens includes a concave inner surface adjacent the semiconductor light emitting element, and the phosphor includes a conformal phosphor layer on the concave inner surface. In yet other embodiments, the optical element includes a lens that overlies the cavity and protrudes away from the cavity, the flexible film further includes a protruding element between the lens and the light emitting element that protrudes towards the cavity, and a conformal phosphor coating is provided on the protruding element. Combinations and subcombinations of these and/or other configurations of phosphor also may be provided. Moreover, an optical coupling media may be provided between the phosphor and the semiconductor light emitting element in any of these embodiments.

In still other embodiments of the present invention, the semiconductor light emitting element includes a wire that extends towards the flexible substrate. In some of these embodiments, the optical element includes a prism that is configured to reduce shadowing by the wire, of the light that is emitted from the semiconductor light emitting element.

Multiple semiconductor light emitting elements and/or optical elements may be incorporated in a semiconductor light emitting device according to various embodiments of the present invention. Each semiconductor light emitting element may be included in its own individual cavity and/or multiple semiconductor light emitting elements may be included in a single cavity. Moreover, in some embodiments, the same phosphor may be included on the flexible film for each optical element. In other embodiments, different phosphors may be used. For example, a first phosphor layer and a first semiconductor light emitting element may be configured to generate red light, a second phosphor layer and a second semiconductor light emitting element may be configured to generate blue light, and a third phosphor layer and a third semiconductor light emitting element may be configured to generate green light. Combinations and subcombinations of these and/or other multiple semiconductor light emitting elements and/or multiple optical elements also may be provided. Finally, combinations and subcombinations of these and/or other optical elements, flexible films, phosphor and/or multiple elements may be provided, according to various embodiments of the present invention.

Semiconductor light emitting devices according to yet other embodiments of the present invention include a substrate comprising alumina, a light emitting diode on a face of the substrate, and a flexible film comprising silicone on the face of the substrate and on the light emitting diode. The flexible film comprising silicone includes therein a lens comprising silicone adjacent the light emitting diode, such that the light emitting diode emits light through the lens. In other embodiments, the flexible film comprising silicone is attached to the substrate, such that the flexible film comprising silicone conforms to the light emitting diode as it expands and contracts during operation thereof. Phosphor also may be provided between the lens and the light emitting diode. Various embodiments of the flexible silicone film, the lens, the phosphor and/or other elements may be provided according to any of the other embodiments described herein.

DETAILED DESCRIPTION

Figure 1:
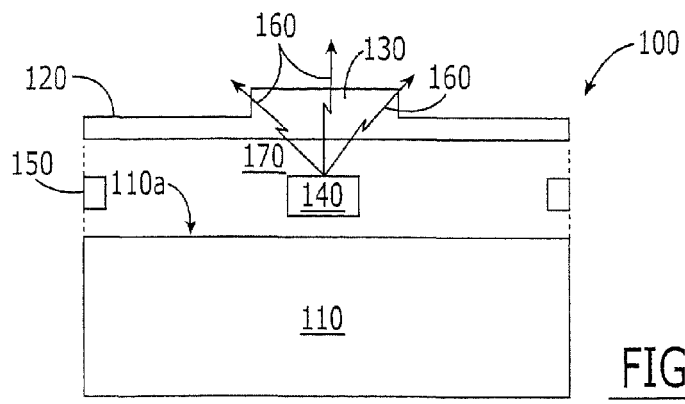
FIG. 1 is an exploded cross-sectional view of semiconductor light emitting devices and fabrication methods therefor, according to various embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

FIG. 1 is an exploded cross-sectional view of semiconductor light emitting devices and assembling methods therefor, according to various embodiments of the present invention. Referring to FIG. 1, these semiconductor light emitting devices 100 include a substrate 110 having a face 110a, a flexible film 120 that includes therein an optical element 130, on the face 110a, and a semiconductor light emitting element 140 between the substrate 110 and the flexible film 120, and configured to emit light 160 through the optical element. An attachment element 150 may be used to attach the flexible film 120 and the substrate 110 to one another.

Still referring to FIG. 1, the substrate 110 may include alumina, aluminum nitride, metal and/or other materials that are conventionally used for mounting semiconductor light emitting elements thereon. In other embodiments, the substrate 110 can be a solid metal block, as described in copending application Ser. No. 10/659,108 to Negley et al., entitled Solid Metal Block Mounting Substrates for Semiconductor Light Emitting Devices, and Oxidizing Methods for Fabricating Same, filed Sep. 9, 2003, now U.S. Pat. No. 7,183,587, assigned to the assignee of the present invention, the disclosure of which is hereby incorporated herein by reference in its entirety as if set forth fully herein. The design of substrates 110 are well known to those having skill in the art and need not be described further herein.

The semiconductor light emitting element 140 may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green LEDs may be provided. The design and fabrication of semiconductor light emitting devices 140 are well known to those having skill in the art and need not be described in detail herein.

For example, the light emitting elements 140 may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, now U.S. Pat. No. 6,853,010, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Still referring to FIG. 1, the flexible film 120 can provide a cover slip that can be made of a flexible material such as a conventional Room Temperature Vulcanizing (RTV) silicone rubber. Other silicone-based and/or flexible materials may be used. By being made of a flexible material, the flexible film 120 can conform to the substrate 110 as it expands and contracts during operations. Moreover, the flexible film 120 can be made by simple low-cost techniques such as transfer molding, injection molding and/or other conventional techniques that are well known to those having skill in the art.

As described above, the flexible film 120 includes therein an optical element 130. The optical element can include a lens, a prism, an optical emission enhancing and/or converting element, such as a phosphor, an optical scattering element and/or other optical element. One or more optical elements 130 also may be provided, as will be described in detail below. Moreover, as shown in FIG. 1, an optical coupling media 170, such as an optical coupling gel and/or other index matching material, may be provided between the optical element 130 and the semiconductor light emitting device 140, in some embodiments.

Still referring to FIG. 1, the attachment element 150 can be embodied as an adhesive that may be placed around the periphery of the substrate 110, around the periphery of the flexible film 120 and/or at selected portions thereof, such as at the corners thereof. In other embodiments, the substrate 110 may be coined around the flexible film 120, to provide an attachment element 150. Other conventional attaching techniques may be used.

FIG. 1 also illustrates methods of assembling semiconductor light emitting devices 100 according to various embodiments of the present invention. As shown in FIG. 1, a semiconductor light emitting element 140 is mounted on a substrate face 110a. A flexible film 120 that includes therein an optical element 130 is attached to the substrate face 110a, for example using an attachment element 150, such that, in operation, the semiconductor light emitting element emits light 160 through the optical element 130. In some embodiments, an optical coupling media 170 is placed between the semiconductor light emitting element 140 and the optical element 130.

Figure 2:
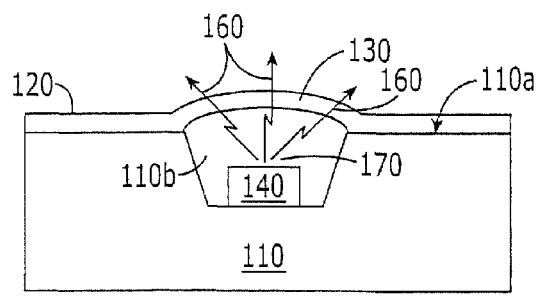
FIGS. 2-12 are cross-sectional views of semiconductor light emitting devices according to various embodiments of the present invention.

FIG. 2 is a cross-sectional view of semiconductor light emitting devices according to other embodiments of the present invention. In these embodiments, the substrate face 110a includes a cavity 110b therein. The flexible film 120 extends onto the face 110a beyond the cavity 110b. The optical element 130 overlies the cavity 110b, and the semiconductor light emitting element 140 is in the cavity 110b, and is configured to emit light 160 through the optical element 130. In FIG. 2, the optical element 130 includes a concave lens. In some embodiments, an optical coupling media 170 is provided in the cavity 110b between the optical element 130 and the semiconductor light emitting element 140. In some embodiments, the optical coupling media 170 fills the cavity 110b.

Figure 3:
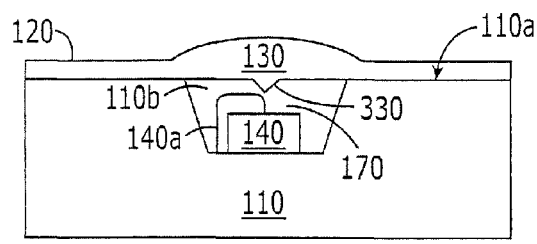

FIG. 3 is a cross-sectional view of other embodiments of the present invention. As shown in FIG. 3, two optical elements 130 and 330 are included in the flexible film 120. A first optical element 130 includes a lens and a second optical element 330 includes a prism. Light from the semiconductor light emitting element 140 passes through the prism 330 and through the lens 130. An optical coupling media 170 also may be provided. In some embodiments, the optical coupling media 170 fills the cavity 110b. The optical coupling media 170 may have a sufficient difference in index of refraction difference from the prism such that the prism can reduce shadowing. As shown in FIG. 3, the semiconductor light emitting element includes a wire 140a that extends towards the flexible film 120, and the prism 330 is configured to reduce shadowing by the wire 140a of the light that is emitted from the semiconductor light emitting element 140. More uniform light emissions thereby may be provided, with reduced shadowing of the wire 140a. It will be understood that the term "wire" is used herein in a generic sense to encompass any electrical connection for the semiconductor light emitting element 140.

Figure 4:
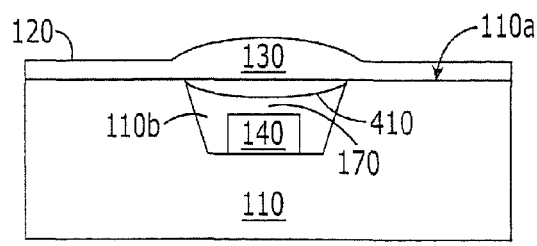

FIG. 4 is a cross-sectional view of other embodiments of the present invention. As shown in FIG. 4, phosphor 410 is provided on the flexible film 120 between the lens 130 and the semiconductor light emitting element 140. The phosphor 410 can include cerium-doped Yttrium Aluminum Garnet (YAG) and/or other conventional phosphors. In some embodiments, the phosphor comprises Cesium doped Yttrium Aluminum Garnet (YAG:Ce). In other embodiments, nano-phosphors may be used. Phosphors are well known to those having skill in the art and need not be described further herein. An optical coupling media 170 also may be provided that may fill the cavity 110*b*.

Figure 5:
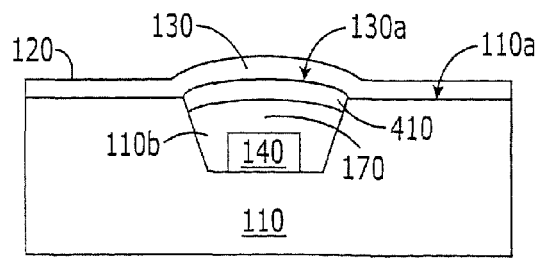

FIG. 5 illustrates yet other embodiments of the present invention. In these embodiments, the lens 130 includes a concave inner surface 130*a* adjacent the semiconductor light emitting element 140, and the phosphor 410 includes a conformal phosphor layer on the concave inner surface 130*a*. An optical coupling media 170 also may be provided that may fill the cavity 110*b*.

Figure 6:
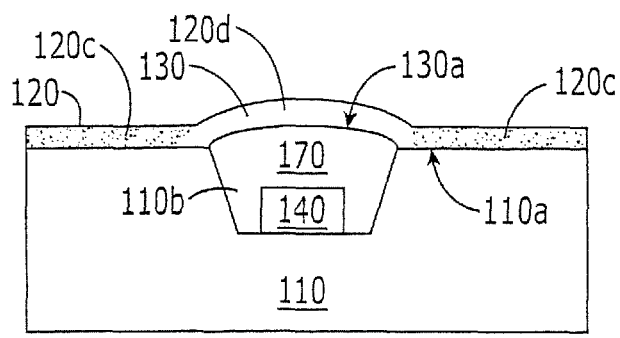

FIG. 6 is a cross-sectional view of other embodiments. As shown in FIG. 6, at least a portion 120*d* of the flexible film 120 that overlies the cavity 110*b* is transparent to the light. Moreover, at least a portion 120*c* of the flexible film 120 that extends onto the face 110*a* beyond the cavity 110*b* is opaque to the light, as shown by the dotted portions 120*c* of the flexible film 120. The opaque regions 120*c* can reduce or prevent bouncing of light rays, and thereby potentially produce a more desirable light pattern. An optical coupling media 170 also may be provided that may fill the cavity 110*b*.

Figure 7:
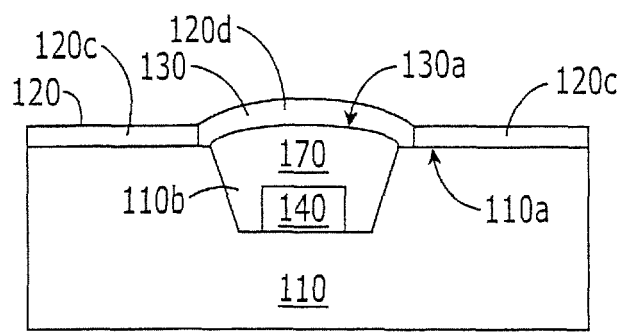

FIG. 7 is a cross-sectional view of other embodiments of the present invention wherein the flexible film 120 may be fabricated of multiple materials. As shown in FIG. 7, at least a portion 120*d* of the flexible film 120 that overlies the cavity 110*b* includes a first material, and at least a portion 120*c* of the flexible film 120 that extends onto the face 110*a* beyond the cavity 110*b* includes a second material. Two or more materials may be used in the flexible film 120 in some embodiments, to provide different characteristics for the portion of the flexible film 120 through which light is emitted and through which light is not emitted. Multiple materials may be used for other purposes in other embodiments. For example, an inflexible and/or flexible plastic lens may be attached to a flexible film. Such a flexible film 120 with multiple materials may be fabricated using conventional multiple molding techniques, for example. In some embodiments, the first material that is molded may not be fully cured, so as to provide a satisfactory bond that attaches to the second material that is subsequently molded. In other embodiments, the same material may be used for the optical element and the flexible film, wherein the optical element is formed and then the flexible film is formed surrounding the optical element. An optical coupling media 170 also may be provided that may fill the cavity 110*b*.

Figure 8:
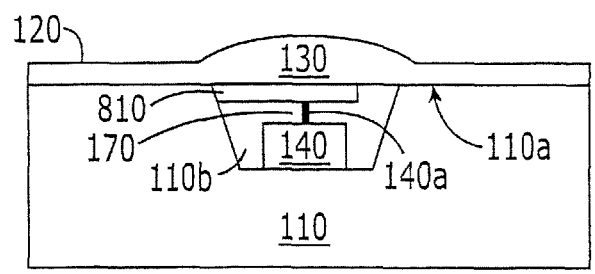

FIG. 8 is a cross-sectional view of other embodiments of the present invention. In these embodiments, the semiconductor light emitting element 140 includes a wire 140*a*, that extends towards and contacts the flexible film 120 in the cavity 110*b*. The flexible film 120 includes a transparent conductor 810 which can include Indium Tin Oxide (ITO) and/or other conventional transparent conductors. The transparent conductor 810 extends in the cavity 110*b* and electrically connects to the wire. Reduced shadowing by the contact 140*a* thereby may be provided. Moreover, a wire bond to the substrate 110, and the potential consequent light distortion, may be reduced or eliminated. An optical coupling media 170 also may be provided that may fill the cavity 110*b*.

Figure 9:
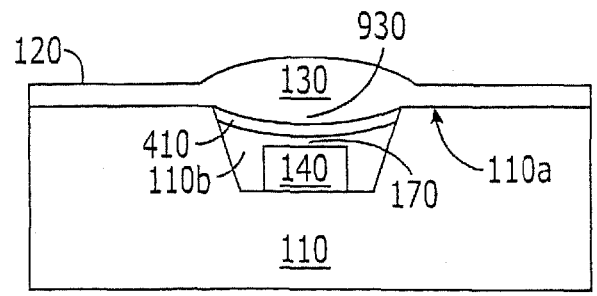

FIG. 9 is a cross-sectional view of other embodiments of the present invention. As shown in FIG. 9, the optical element 130 includes a lens that overlies the cavity 110*b* and protrudes away from the cavity 110*b*. The flexible film 120 further includes a protruding element 930 between the lens 130 and the light emitting element 140 that protrudes towards the cavity 110*b*. As shown in FIG. 9, a conformal phosphor layer 410 is provided on the protruding element 930. By providing the protruding element 930 on the back of the lens 130, optical coupling media 170 in the device may be displaced. Arrangements of FIG. 9 may thus provide more uniform phosphor coating at desired distances from the light emitting element 140, so as to provide more uniform illumination. The optical coupling media 170 may fill the cavity 110*b*.

Figure 10:
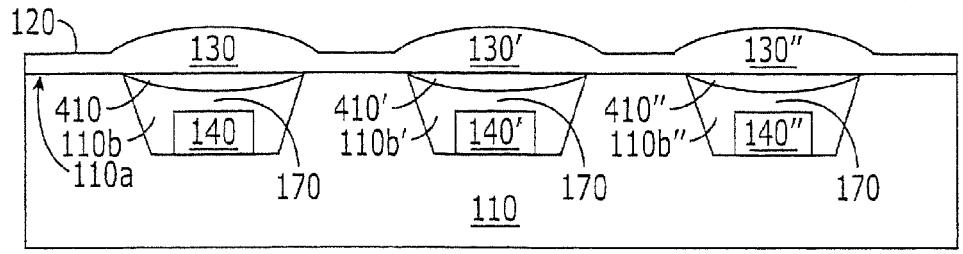
Figure 11:
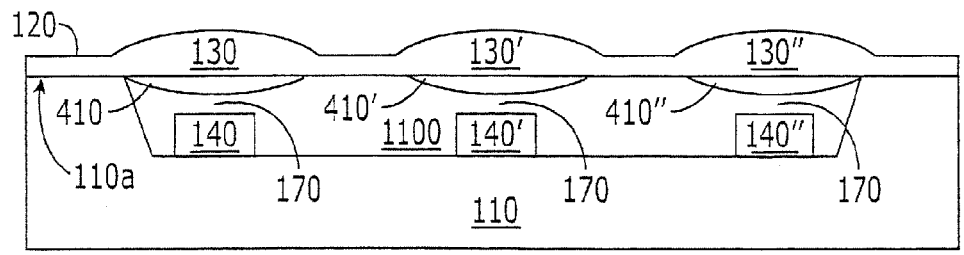

FIGS. 10 and 11 illustrate semiconductor light emitting devices including multiple semiconductor light emitting elements and/or multiple optical elements according to various embodiments of the present invention. For example, as shown in FIG. 10, the optical element 130 is a first optical element, and the semiconductor light emitting element 140 is a first semiconductor light emitting element. The flexible film 120 also includes therein a second optical element 130' that is spaced apart from the first optical element 130, and the device further includes a second semiconductor light emitting element 140' between the substrate 110 and the flexible film 120, and configured to emit light through the second optical element 130'. Moreover, a third optical element 130" and a third semiconductor light emitting element 140" also may be provided. The optical elements 130, 130' and 130" may be the same and/or different from one another, and the semiconductor light emitting elements 140, 140' and 140" may be the same and/or different from one another. Moreover, in embodiments of FIG. 10, the cavity 110*b* a first cavity, and second and third cavities 110*b'*, 110*b"*, respectively, are provided for the second and third semiconductor light emitting elements 140', 140", respectively. The cavities 110*b*, 110*b'* and 110*b"* may be the same and/or may have different configurations from one another. An optical coupling media 170 also may be provided that may fill the cavity or cavities.

As also shown in FIG. 10, the phosphor 410 may be a first phosphor layer, and second and/or third phosphor layers 410' and 410", respectively, may be provided on the flexible film 120 between the second optical element 130' and the second semiconductor light emitting element 140', and between the third optical element 130" and the third semiconductor light emitting element 140", respectively. The phosphor layers 410, 410', 410" may be the same, may be different and/or may be eliminated. In particular, in some embodiments of the present invention, the first phosphor layer 410 and the first semiconductor light emitting element 140 are configured to generate red light, the second phosphor layer 410' and the second semiconductor light emitting element 140' are configured to generate blue light, and the third phosphor layer 410" and the third semiconductor light emitting element 140" are configured to generate green light. A Red, Green, Blue (RGB) light emitting element that can emit white light thereby may be provided in some embodiments.

FIG. 11 is a cross-sectional view of other embodiments of the present invention. In these embodiments, a single cavity 1100 is provided for the first, second and third semiconductor light emitting elements 140, 140' and 140", respectively. An optical coupling media 170 also may be provided that may fill the cavity 1100.

Figure 12:
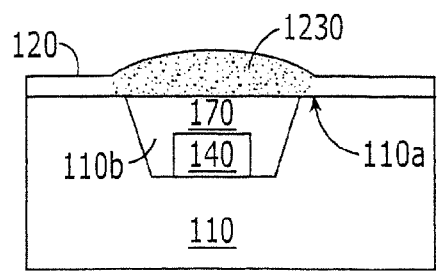

FIG. 12 is a cross-sectional view of yet other embodiments of the present invention. In FIG. 12, the optical element 1230 comprises a lens having phosphor dispersed therein. Lenses including phosphor dispersed therein are described, for example, in application Ser. No. 10/659,240 to Negley et al., entitled Transmissive Optical Elements Including Transparent Plastic Shell Having a Phosphor Dispersed Therein, and Methods of Fabricating Same, filed Sep. 9, 2003, now U.S. Pat. No. 7,029,935, assigned to the assignee of the present invention, the disclosure of which is hereby incorporated herein by reference in its entirety as if set forth fully herein. An optical coupling media 170 also may be provided that may fill the cavity 110b.

In still other embodiments of the present invention, an optical scattering element may be embedded in the lens as shown in FIG. 12, and/or provided as a separating layer as shown, for example, in FIG. 9, in addition or instead of phosphor.

Figure 13:
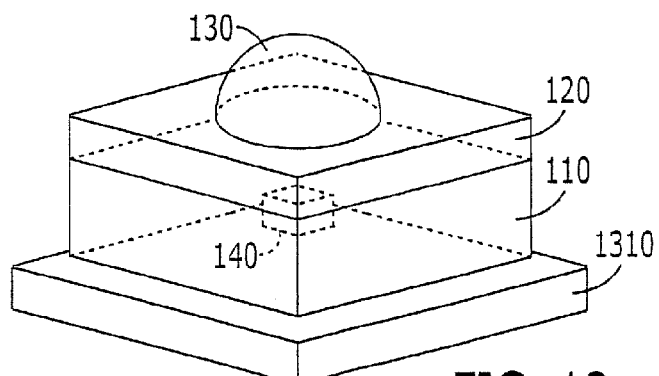
FIG. 13 is a perspective view of a semiconductor light emitting device according to various embodiments of the present invention.

FIG. 13 is a perspective view of semiconductor light emitting devices according to other embodiments of the present invention. The substrate 110 is attached to a conventional package 1310. An optical coupling media 170 also may be provided.

It will be understood by those having skill in the art that various embodiments of the invention have been described individually in connection with FIGS. 1-13. However, combinations and subcombinations of the embodiments of FIGS. 1-13 may be provided according to various embodiments of the present invention.

Additional discussion of various embodiments of the present invention now will be provided. In particular, in some embodiments, the flexible film 120 that was described above may be made of a flexible material such as RTV, GE RTV 615 marketed by GE, UR 234 marketed by Thermoset/Lord Corp. and/or other conventional flexible materials, and in some embodiment may be between about 25 μm and about 500 μm thick. The flexible film 120 incorporates one or more optical elements 130 to achieve a desired optical design. Being made of a flexible material, the flexible film 120 can conform to the semiconductor light emitting device as it expands and contracts. Moreover, in some embodiments, the flexible film can be fabricated by simple low cost techniques such as transfer molding, injection molding and/or other techniques, and may include multiple optical elements and/or other features on either side of the flexible film membrane. This may permit a "single" placement of a complex optical element upon a package (or substrate to a package) that can include multiple LED emitters.

Conventionally, LED packages use a lens molded from rigid plastic or glass. Either a hard encapsulant is used to encapsulate the chip and form the optical element, or a lens is applied upon an optical coupling media, such as an optical gel, for example Nye optical gel. The hard encapsulant may be plagued by optical degradation and high stress on LED chips, and power LED chips in particular, and the optical coupling media may also potentially create problems because this gel may be exposed on the surface of the part which may result in trapping of dust/debris on the exposed material due to the stickiness of the gel. In contrast, flexible films 120 according to some embodiments of the present invention can be the terminating surface of the package using an optical coupling media 170, and also includes the optical elements 130, such as one or more optical lens. The ability to place one unit (the flexible film with multiple optical elements) can potentially provide a benefit when using a package that has multiple LEDs in it. Instead of placing a lens for each LED, the single placement of a flexible film 130 can be provided.

Still other features can be incorporated into the flexible film 130. For example, on the opposing side of the optical lens, a filled region including a phosphor and/or an optical coupling media 170 may be incorporated to give the features of a paint-on lens for making white light. A paint-on lens for making white light is described in application Ser. No. 10/666,399 to Michael Leung, entitled Molded Chip Fabrication Method and Apparatus, filed Sep. 18, 2003, now U.S. Patent Application Publication 2005/0062140, assigned to the assignee of the present invention, the disclosure of which is hereby incorporated herein by reference in its entirety as if set forth fully herein.

Some embodiments of the present invention can reduce or minimize the volume of optical coupling media 170, by providing a protrusion such as was described, for example, in FIG. 9. By reducing the amount of optical coupling media 170, a more uniform light emission may be provided. Thus, these and/or other embodiments of the present invention can reduce or eliminate angular-dependent radiation patterns of light output from the light emitting device, such as angular dependence of Color Correlated Temperature (CCT). Thus, light intensity and the x, y chromaticity values/coordinates from all surfaces of the device can remain relatively constant in some embodiments. This may be advantageous when used for illumination applications, such as in a room, where a spotlight effect is not desirable.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor light emitting device comprising:
   a substrate having a face;
   a cavity on said face;
   first and second semiconductor light emitting elements in the cavity;
   a first phosphor layer that is spaced apart from the first semiconductor light emitting element and is arranged such that light that is emitted by the first semiconductor light emitting element impinges on the first phosphor layer; and
   a second phosphor layer that is spaced apart from the second semiconductor light emitting element and is arranged such that light that is emitted by the second semiconductor light emitting element impinges on the second phosphor layer;
   wherein the first semiconductor light emitting element and the first phosphor layer are configured to emit light of a first color and the second semiconductor light emitting element and the second phosphor layer are configured to emit light of a second color that is different from the first color.

2. A semiconductor light emitting device according to claim 1 further comprising a cover that overlies the cavity and wherein the first and second phosphor layers are in and/or on the cover.

3. A semiconductor light emitting device according to claim 2 further comprising:
   a first lens adjacent the first phosphor layer; and
   a second lens adjacent the second phosphor layer.

4. A semiconductor light emitting device according to claim 2 further comprising:
   a first optical scattering element adjacent the first phosphor layer; and
   a second optical scattering element adjacent the second phosphor layer.

5. A semiconductor light emitting device according to claim 4 further comprising a cover that overlies the cavity and wherein the first and second phosphor layers and the first and second optical scattering elements are in, on and/or comprise the cover.

6. A semiconductor light emitting device according to claim 1 further comprising:
a third semiconductor light emitting element in the cavity; and
a third phosphor layer that is spaced apart from the third semiconductor light emitting element and is arranged such that light that is emitted by the third semiconductor light emitting element impinges on the third phosphor layer;
wherein the first semiconductor light emitting element and the first phosphor layer are configured to emit red light, the second semiconductor light emitting element and the second phosphor layer are configured to emit blue light and the third semiconductor light emitting element and the third phosphor layer are configured to emit green light.

7. A semiconductor light emitting device according to claim 6 further comprising a cover that overlies the cavity and wherein the first, second and third phosphor layers are in and/or on the cover.

8. A semiconductor light emitting device according to claim 1 wherein the substrate comprises solid metal.

9. A semiconductor light emitting device according to claim 1 wherein the substrate comprises aluminum.

10. A semiconductor light emitting device comprising:
a substrate having a face;
a cavity on said face;
first and second semiconductor light emitting elements in the cavity;
a first optical scattering element that is spaced apart from the first semiconductor light emitting element and is arranged such that light that is emitted by the first semiconductor light emitting element impinges on the first optical scattering element; and
a second optical scattering element that is spaced apart from the second semiconductor light emitting element and is arranged such that light that is emitted by the second semiconductor light emitting element impinges on the second optical scattering element;
wherein the first semiconductor light emitting element is configured to emit light of a first color and the second semiconductor light emitting element is configured to emit light of a second color that is different from the first color.

11. A semiconductor light emitting device comprising:
a substrate having a face;
a cavity on said face;
first and second semiconductor light emitting elements in the cavity, wherein the first semiconductor light emitting element is configured to emit light of a first color and the second semiconductor light emitting element is configured to emit light of a second color that is different from the first color; and
first and second optical elements outside the cavity that are responsive to light that is emitted by the first and second semiconductor light emitting elements, respectively.

12. A semiconductor light emitting device according to claim 11:
wherein the first optical element comprises a first phosphor layer that is spaced apart from the first semiconductor light emitting element and is arranged such that light that is emitted by the first semiconductor light emitting element impinges on the first phosphor layer; and
wherein the second optical element comprises a second phosphor layer that is spaced apart from the second semiconductor light emitting element and is arranged such that light that is emitted by the second semiconductor light emitting element impinges on the second phosphor layer.

13. A semiconductor light emitting device according to claim 12 further comprising a cover that overlies the cavity and wherein the first and second phosphor layers are in, on and/or comprise the cover.

14. A semiconductor light emitting device according to claim 12 further comprising:
a first lens adjacent the first phosphor layer; and
a second lens adjacent the second phosphor layer.

15. A semiconductor light emitting device according to claim 12 further comprising:
a first optical scattering element adjacent the first phosphor layer; and
a second optical scattering element adjacent the second phosphor layer.

16. A semiconductor light emitting device according to claim 15 further comprising a cover that overlies the cavity and wherein the first and second phosphor layers and the first and second optical scattering elements are in and/or on the cover.

17. A semiconductor light emitting device according to claim 11 wherein the substrate comprises solid metal.

18. A semiconductor light emitting device according to claim 11 wherein the substrate comprises aluminum.

* * * * *